(12) United States Patent
Yeh et al.

(10) Patent No.: US 8,888,525 B2
(45) Date of Patent: Nov. 18, 2014

(54) ELECTRICAL CONNECTOR WITH DUAL ARM CONTACT

(71) Applicants: Cheng-Chi Yeh, New Taipei (TW); Ke-Hao Chen, New Taipei (TW)

(72) Inventors: Cheng-Chi Yeh, New Taipei (TW); Ke-Hao Chen, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 34 days.

(21) Appl. No.: 13/787,850

(22) Filed: Mar. 7, 2013

(65) Prior Publication Data

US 2013/0237066 A1  Sep. 12, 2013

(30) Foreign Application Priority Data

Mar. 7, 2012 (TW) ................................. 101204078

(51) Int. Cl.
| | |
|---|---|
| *H01R 13/66* | (2006.01) |
| *H01R 13/24* | (2006.01) |
| *H05K 7/10* | (2006.01) |
| *H01R 13/17* | (2006.01) |
| *H01R 12/57* | (2011.01) |
| *H01R 12/52* | (2011.01) |

(52) U.S. Cl.
CPC .............. *H05K 7/10* (2013.01); *H01R 13/2457* (2013.01); *H01R 12/57* (2013.01); *H01R 12/52* (2013.01); *H01R 13/17* (2013.01)
USPC .......................................................... 439/539

(58) Field of Classification Search
CPC .............................. H01R 25/006; H01R 12/57
USPC ............................ 439/539, 66, 71, 81, 72, 83
See application file for complete search history.

(56) References Cited

U.S. PATENT DOCUMENTS

| | | | | |
|---|---|---|---|---|
| 4,959,029 | A  * | 9/1990 | Grabbe | 439/862 |
| 7,445,460 | B1 * | 11/2008 | Fan et al. | 439/66 |
| 7,517,224 | B2 * | 4/2009 | Fan et al. | 439/66 |
| 7,534,113 | B2 | 5/2009 | Liao et al. | |
| 7,563,105 | B2 * | 7/2009 | Liu et al. | 439/66 |
| 7,878,823 | B2 * | 2/2011 | Fan | 439/83 |
| 8,123,574 | B2 * | 2/2012 | Ma | 439/862 |
| 2011/0177726 | A1 * | 7/2011 | Koyama et al. | 439/839 |

* cited by examiner

*Primary Examiner* — Phuongchi T Nguyen
(74) *Attorney, Agent, or Firm* — Wei Te Chung; Ming Chieh Chang

(57) ABSTRACT

A contact includes a base portion having an upper end and a lower end opposite to the upper end, a first spring arm extending obliquely and upwardly from the upper end of the base portion, and a second spring arm extending obliquely and upwardly from the lower end of the base portion and towards the first spring arm, wherein the second spring arm locates under the first spring arm, a supporting portion is defined on a distal end of the second spring arm and slides along the first spring arm to support the first spring arm when the first spring arm is pressed down by an electronic component.

14 Claims, 5 Drawing Sheets

ELECTRICAL CONNECTOR WITH DUAL ARM CONTACT

BACKGROUND OF THE INVENTION

1. Field of the Invention

The present disclosure relates to a contact for connecting an IC package with a circuit board, and particularly to a contact having dual arm so as to provide better mechanical and electrical properties therebetween.

2. Description of Related Art

Various electrical contacts are widely used in a part of computer connectors. A Land Grid Array (LGA) contact for connecting a Central Processing Unit (CPU) with a pad to a circuit board is typically comprises a deformable spring arm and a tail. At the end of the spring arm, a contacting portion is defined for contacting the pad of the CPU while the tail is used for connecting the circuit board so as to establish an electrical connection between the CPU and the circuit board. U.S. Pat. No. 7,534,113 issued to Liao, et al. on May 19, 2009 discloses a LGA contact. The contact comprises a retention portion, a spring arm extending above the retention portion and a tail portion extending downwardly from the retention portion. The spring arm comprises a contacting portion for contacting an electronic component, such as a CPU, and the tail portion is used to be soldered on the printed circuit board so that an electrical connection can be established therebetween.

However, as the abovementioned contact each comprises a single spring arm, the normal force from the electronic component, such as a CPU, imposes on the single spring arm totally. In order to provide an enough supporting force, the spring arm has to experience a large elastic deformation which result in a long time to establish a steady electrical connection therebetween. Even more seriously, a large elastic deformation may damage the spring arm which result in a failure of the electrical connection between the CPU and the printed circuit board.

In view of the above, an improved contact and an electrical connector are desired to overcome the problems mentioned above.

SUMMARY OF THE INVENTION

Accordingly, an object of the present disclosure is to provide a contact and an electrical connector in which an electrical connection between two electronic components can be established quickly, and the strength of the material manufacturing the contact can be decreased for cost down.

According to one aspect of the present disclosure, a contact is provided for electrically connecting two electronic components. The contact comprises a base portion having an upper end and a lower end opposite to each other, a first spring arm extending obliquely and upwardly from the upper end of the base portion, and a second spring arm extending obliquely and upwardly towards the first spring arm from the lower end of the base portion, wherein a supporting portion is defined on a distal end of the second spring arm, the second spring arm locates under the first spring arm, and the supporting portion is capable of sliding along the first spring arm to support the first spring arm when the first spring arm is pressed down by the electronic component. The present disclosure also provides an electrical connector having such contacts.

Other objects, advantages and novel features of the disclosure will become more apparent from the following detailed description when taken in conjunction with the accompanying drawings, in which:

DETAILED DESCRIPTION OF THE INVENTION

Reference will now be made to the drawings to describe the present disclosure in detail.

Figure 1:
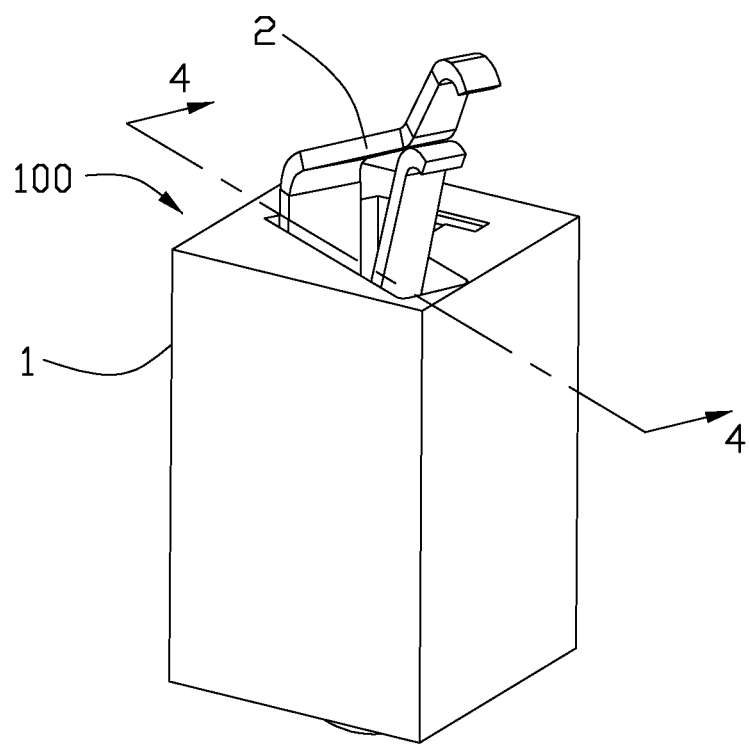
FIG. 1 is an assembled, perspective view of an electrical connector in accordance with a preferred embodiment of the present disclosure.
Figure 2:
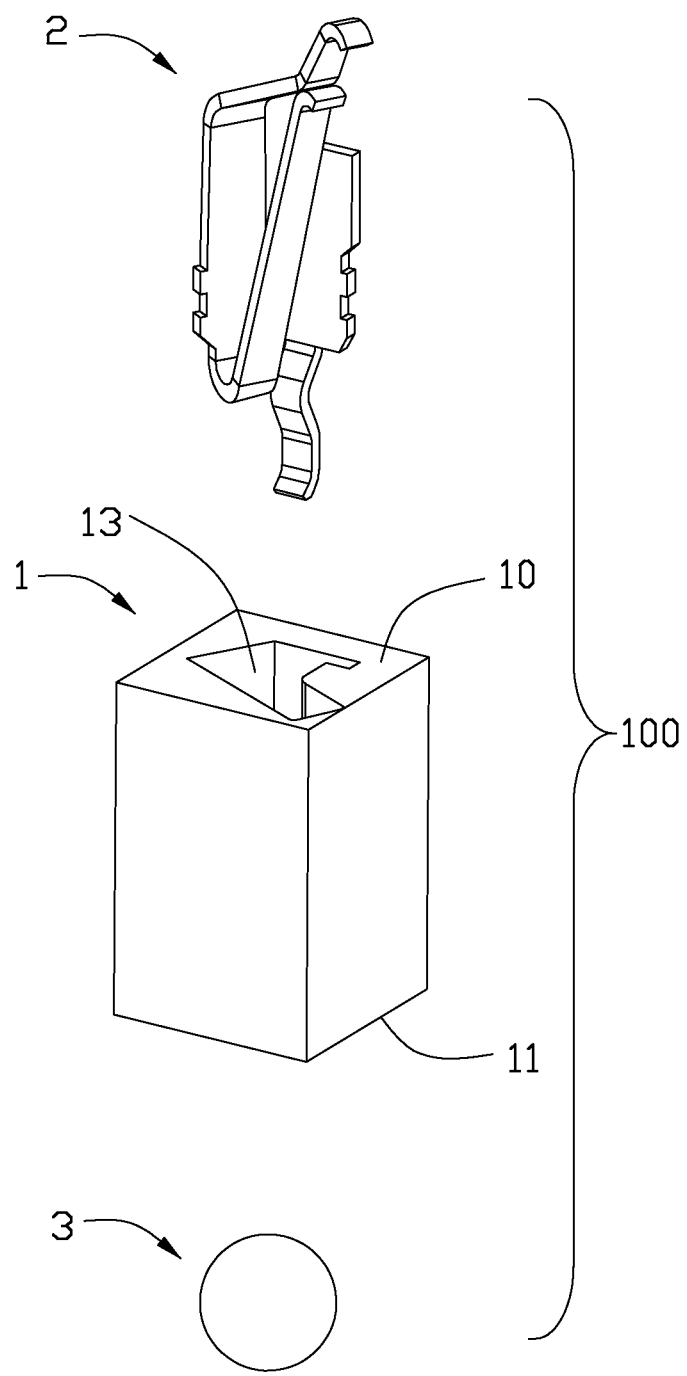
FIG. 2 is an exploded, perspective view of the electrical connector shown in FIG. 1.

Referring to FIG. 1 and FIG. 2, an electrical connector 100 for electrically connecting two electronic components, such as an IC package (not shown) and a printed circuit board (not shown), comprises an insulating housing 1, a plurality of contacts 2 retained in the insulating housing 1, and a plurality of solder balls 3 corresponding to the contacts 2 for soldering on the printed circuit board.

Referring to FIG. 2, the insulating housing 1 comprises a top surface 10, a bottom surface 11 opposite to the top surface 10, and a plurality of receiving holes 13 running through therebetween.

Figure 3:
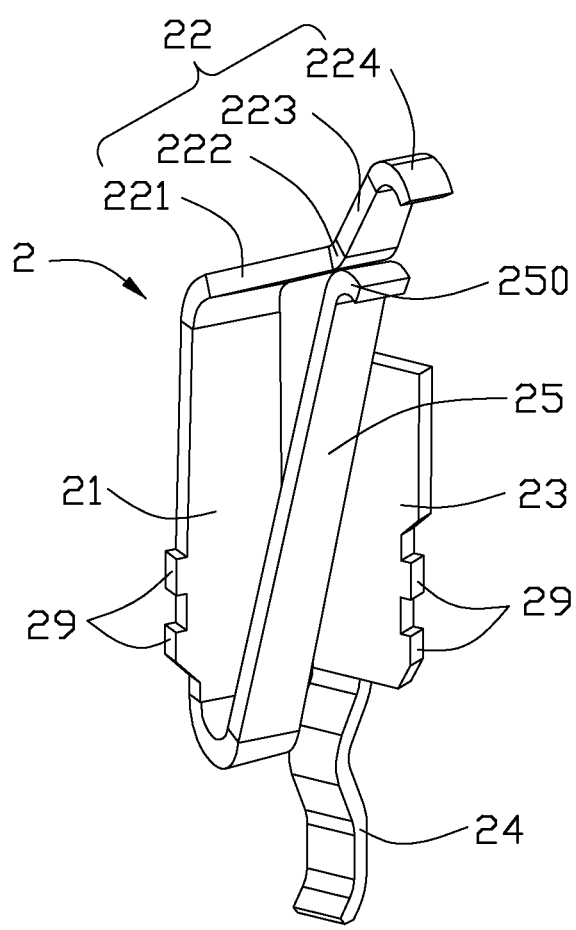
FIG. 3 is a perspective view of the contact shown in FIG. 1.
Figure 4:
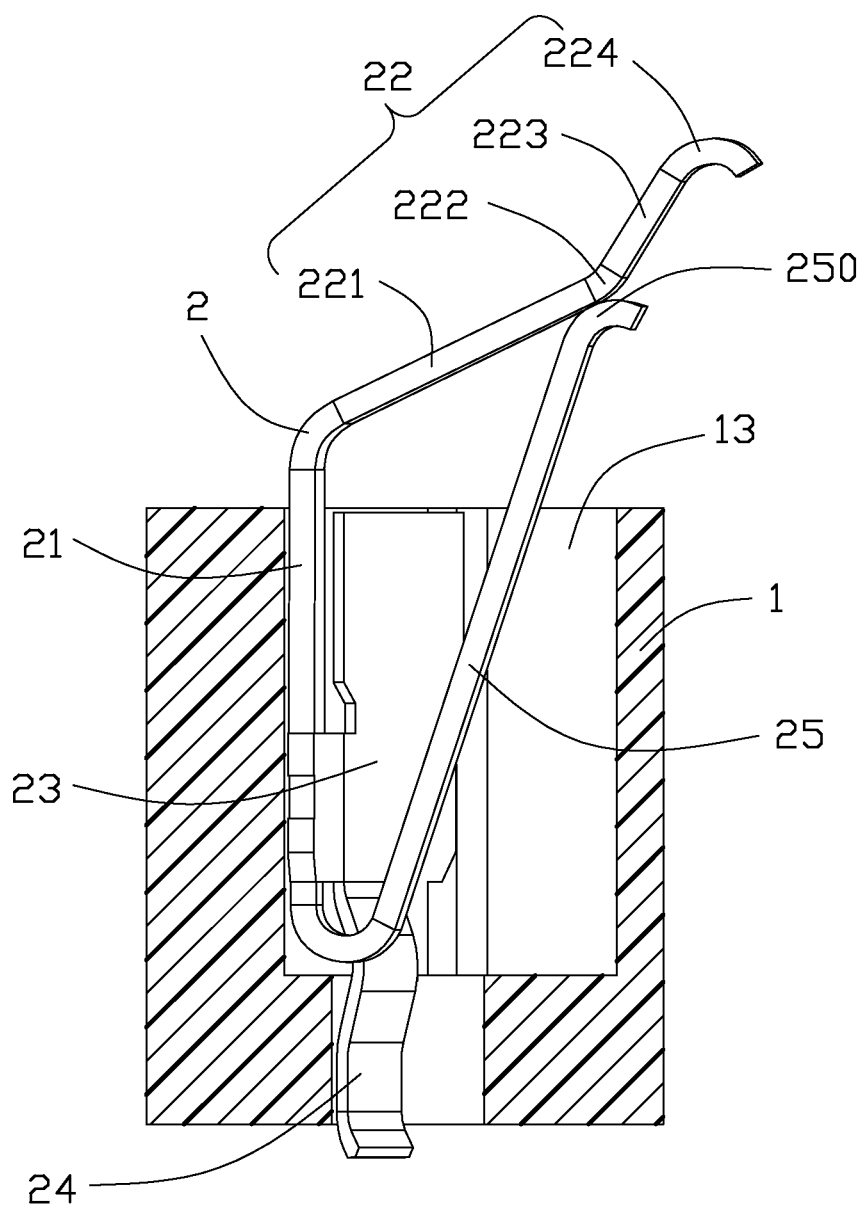
FIG. 4 is a sectional view of the electrical connector shown in FIG. 1 along line 4-4, wherein the contact is not pressed down.

Referring to FIG. 3 and FIG. 4, the contact 2 is stamped from a metal plate. The contact 2 retained in the insulating housing 1 comprises a plate-like base portion 21 having an upper end, a lower end opposite to the upper end, and two sides opposite to each other. A first spring arm 22 extends obliquely and upwardly from the upper end of the base portion 21. The first spring arm 22 successively comprises a connecting section 221, an arc-shaped section 222, a linear section 223 and a contacting portion 224 in a direction it extending towards. The connecting section 221 extends obliquely from the base portion 21 and connects the base portion 21 and the arc-shaped section 222. The arc-shaped section 222 protrudes downwardly and connects the connecting section 221 and the linear section 223 smoothly. The contacting portion 224 is defined on a top end of the first spring arm 22 and protrudes upwardly for contacting with the IC package. The linear section 223 further extends obliquely and upwardly from the arc-shaped section 222 and connects the arc-shaped section 222 and the contacting portion 224. A slope of the linear section 223 is larger than the connecting section 221.

A retaining portion 23 extends from one side of the base portion 21 and defines an obtuse angle with the base portion 21 so that the first spring arm 22 extends in a diagonal direction of the insulating housing 1. At the other side of the base portion 21 and a peripheral edge of the retaining portion 23, a pair of barbs 29 is defined thereon for engaging with the insulating housing 1. A soldering portion or soldering arm 24 extends downwardly from the retaining portion 23 for clamping the solder ball 3 mechanically.

The contact 2 further comprises a second spring arm 25 extending obliquely and upwardly towards the first spring arm 22 from the lower end of the base portion 21. The second spring arm 25 locates under the first spring arm 22 and touches the first spring arm 22. The second spring arm 25 comprises a supporting portion 250 at thereof a distal end or an apex far from the lower end of the base portion 21. The supporting portion 250 is an arc-shaped emboss with a smooth surface protruding towards the first spring arm 22 and contacting the arc-shaped section 222 of the first spring arm 22.

Figure 5:
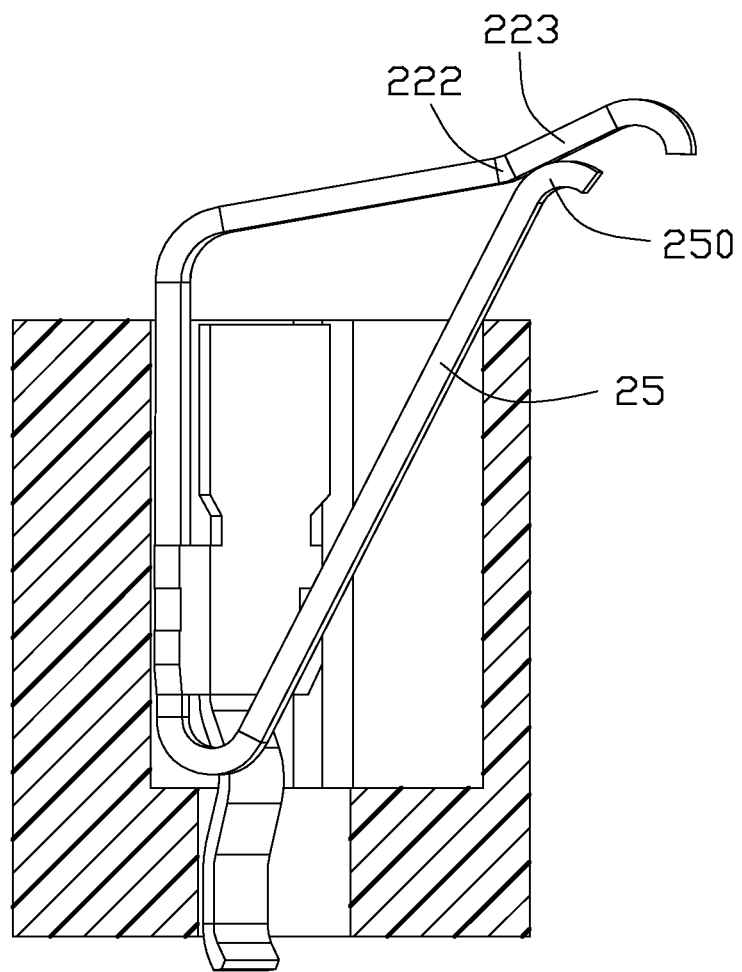
FIG. 5 is a view similar to FIG. 4, wherein the contact is pressed down.

Referring to FIG. 4 and FIG. 5, when contacting the IC package to the printed circuit board, the first spring arm 22 moves downwardly to push the second spring arm 25. The second spring arm 25 experiences a rotary motion around a lowest point of the second spring arm 25 opposite to the supporting portion 250. The supporting portion 250 slides along the first spring arm 22 from the arc-shaped section 222 to the linear section 223 until a steady electrical connection established therebetween.

The electrical connector 100 in accordance with a preferred embodiment of the present disclosure comprises the second spring arm 25 for supporting the first spring arm 22 when the first spring arm 22 is pressed down by the electronic component. Thus, a steady electrical connection between two electronic components can be established quickly, and the strength of the material manufacturing the contact 2 can be decreased for cost down. Furthermore, the supporting portion 250 slides pass through the arc-shaped section 222 and the linear section 223 performing two different force-deflection curves. The slope of the force-deflection curve on the arc-shaped section 222 is larger than the slope of the force-deflection curve on the linear section 223, thus the tolerance of the contact 2 can be pre-defined on the linear section 223 to decrease the negative effect of the tolerance on the normal force.

While preferred embodiment in accordance with the present disclosure has been shown and described, equivalent modifications and changes known to persons skilled in the art according to the spirit of the present disclosure are considered within the scope of the present disclosure as defined in the appended claims.

What is claimed is:

1. A contact for electrically connecting an electronic component comprising:
    a base portion comprising an upper end, a lower end opposite to the upper end, and two sides opposite to each other;
    a first spring arm extending obliquely and upwardly from the upper end of the base portion, the first spring arm comprising a contacting portion for contacting the electronic component; and
    second spring arm extending obliquely and upwardly from the lower end of the base portion and towards the first spring arm, a supporting portion defined on a distal end of the second spring arm far from the lower end of the base portion; wherein
    the second spring arm locates under the first spring arm, and the supporting portion is capable of sliding along the first spring arm to support the first spring arm when the contacting portion is pressed down by the electronic component;
    wherein the first spring arm comprises an arc-shaped section protruding towards the second spring arm, the supporting portion of the second spring arm contacting the arc-shaped section when the first spring arm is not pressed down;
    wherein the first spring arm comprises a linear section extending obliquely and upwardly from the arc-shaped section, the supporting portion of the second spring arm slides from the arc-shaped section to the linear section when the first spring arm is pressed down by the electronic component;
    wherein the contact further comprises a retaining portion extending from one side of the base portion and defining an obtuse angle with the base portion;
    wherein the contact further comprises a soldering portion extending downwardly from the retaining portion for soldering.

2. The contact as claimed in claim 1, wherein the linear section is located between and connecting the arc-shaped section and the contacting portion.

3. The contact as claimed in claim 1, wherein the first spring arm comprises a connecting section extending obliquely and upwardly from the base portion and connecting the base portion and the arc-shaped section.

4. The contact as claimed in claim 1, wherein the first spring arm and the second spring arm extending obliquely in the same direction.

5. The contact as claimed in claim 1, wherein the supporting portion is an arc-shaped emboss with a smooth surface protruding towards the first spring arm.

6. The contact as claimed in claim 1, wherein the base portion comprises at least one barb at the other side, and the retaining portion comprises at least one barb at the peripheral side far from the base portion.

7. An electrical connector for electrically connecting an IC package to a circuit board comprising:
    an insulating housing having a receiving hole; and
    a contact retained in the receiving hole comprising:
    a base portion having an upper end and a lower end opposite to the upper end;
    a first spring arm extending obliquely and upwardly from the upper end of the base portion, and above the insulating housing for contacting with the IC package; and
    a second spring arm extending obliquely and upwardly towards the first spring arm from the lower end of the base portion; wherein
    the second spring arm is located under the first spring arm, and experiences a rotary motion around a lowest point of the second spring arm, a distal end of the second spring arm far from the lowest point slides along the first spring arm when the first spring arm is pressed down by the IC package;
    wherein the first spring arm comprises an arc-shaped section protruding towards the second spring arm, the supporting portion of the second spring arm contacting the arc-shaped section when the first spring arm is not pressed down;
    wherein the first spring arm comprises a linear section extending obliquely and upwardly from the arc-shaped section, the supporting portion of the second spring arm slides from the arc-shaped section to the linear section when the first spring arm is pressed down by the electronic component;
    wherein the contact further comprises a retaining portion extending from one side of the base portion and defining an obtuse angle with the base portion;
    wherein the contact further comprises a soldering portion extending downwardly from the retaining portion for soldering.

8. The electrical connector as claimed in claim 7, wherein the second spring arm extends beyond the receiving hole.

9. An electrical connector comprising:
    an insulative housing defining at least one passageway extending therethrough in a vertical direction; beyond both opposite upper and bottom surfaces thereof;
    at least one contact disposed in the passageway and defining a base portion retained to the housing;

an upper spring arm unitarily extending from an upper section of the base portion and beyond the upper surface in an oblique manner; and a lower spring arm unitarily extending from a portion below said upper section and successively in an upward oblique manner essentially right under the upper spring arm; wherein the lower spring arm defines a supporting portion at an apex thereof to abut against an undersurface of the upper spring arm at least when the upper spring arm is downward pressed by an electronic package to downward press the lower spring arm;

wherein the upper spring arm comprises an arc-shaped section protruding towards the lower spring arm, the supporting portion of the lower spring arm contacting the arc-shaped section when the upper spring arm is not pressed down;

wherein the upper spring arm comprises a linear section extending obliquely and upwardly from the arc-shaped section, the supporting portion of the lower spring arm slides from the arc-shaped section to the linear section when the upper spring arm is pressed down by the electronic component;

wherein the contact further comprises a retaining portion extending from one side of the base portion and defining an obtuse angle with the base portion;

wherein the contact further comprises a soldering portion extending downwardly from the retaining portion for soldering.

10. The electrical connector as claimed in claim 9, wherein said apex is located above the upper surface at least before the lower spring arm is downwardly pressed by the upper spring arm.

11. The electrical connector as claimed in claim 9, wherein said base portion is equipped with retention mechanism for retain the contact in position in the passageway.

12. The electrical connector as claimed in claim 9, wherein said lower spring arm extends from a bottom end of the base portion.

13. The electrical connector as claimed in claim 9, wherein the base portion, the upper spring arm and the lower spring arm commonly define a triangular configuration, and the supporting portion is located at one apex of said triangular configuration.

14. The electrical connector as claimed in claim 9, wherein said contact further defines a retention portion side by side arranged the base portion with retention mechanism thereof, and a soldering arm extends downwardly obliquely from a lower end of the retention portion for holding a solder ball thereabouts.

* * * * *